US012744314B2

(12) United States Patent
Mesquita

(10) Patent No.: US 12,744,314 B2
(45) Date of Patent: Sep. 22, 2026

(54) RF PHASE SHIFTER

(71) Applicant: Telefonaktiebolaget LM Ericsson (publ), Stockholm (SE)

(72) Inventor: Fabien Mesquita, Limhamn (SE)

(73) Assignee: Telefonaktiebolaget LM Ericsson (publ), Stockholm (SE)

( * ) Notice: Subject to any disclaimer, the term of this patent is extended or adjusted under 35 U.S.C. 154(b) by 479 days.

(21) Appl. No.: 18/019,262

(22) PCT Filed: Aug. 5, 2020

(86) PCT No.: PCT/EP2020/072058
§ 371 (c)(1),
(2) Date: Feb. 2, 2023

(87) PCT Pub. No.: WO2022/028695
PCT Pub. Date: Feb. 10, 2022

(65) Prior Publication Data
US 2023/0282977 A1 Sep. 7, 2023

(51) Int. Cl.
*H01Q 3/38* (2006.01)
*H01P 1/18* (2006.01)
(Continued)

(52) U.S. Cl.
CPC ................. *H01Q 3/38* (2013.01); *H01P 1/18* (2013.01); *H03H 7/09* (2013.01); *H03H 7/20* (2013.01)

(58) Field of Classification Search
CPC ... H01Q 3/38; H01P 1/18; H03H 7/09; H03H 7/20; H03H 7/48
See application file for complete search history.

(56) References Cited

U.S. PATENT DOCUMENTS 4,725,767 A * 2/1988 Mori ........................ H03H 7/18 333/172
9,093,984 B1 * 7/2015 Hageman ............... H03H 11/36
(Continued)

FOREIGN PATENT DOCUMENTS

JP S5673916 A 6/1981
WO 2018119153 A2 6/2018

OTHER PUBLICATIONS

Jeon, et al., "A High Linearity +44.5-dBm IP3 C-Band 6-Bit Digital Phase Shifter Using SOI Technology for Phased Array Applications," IEEE Microwave and Wireless Components Letters, vol. 29, Issue 11, Nov. 2019, 4 pages.
(Continued)

*Primary Examiner* — Vladimir Magloire
*Assistant Examiner* — Anna K. Gosling
(74) *Attorney, Agent, or Firm* — Withrow & Terranova, PLLC

(57) ABSTRACT

Embodiments of a Radio Frequency (RF) phase shifter are disclosed. In one embodiment, an RF phase shifter comprises a first transformer comprising a primary winding coupled to a first RF port of the RF phase shifter and a secondary winding that is magnetically coupled to the primary winding. The RF phase shifter further comprises at least one capacitor circuit having a first terminal coupled to the secondary winding of the first transformer and a second terminal coupled to a primary winding of a second transformer. The RF phase shifter and combiner further comprises the second transformer, where the primary winding of the secondary transformer is coupled to the second terminal of the at least one capacitor circuit, and a secondary winding of the second transformer is coupled to a second RF port of the RF phase shifter.

18 Claims, 9 Drawing Sheets

(51) Int. Cl.
*H03H 7/09* (2006.01)
*H03H 7/20* (2006.01)

(56) References Cited

U.S. PATENT DOCUMENTS

| | | | | |
|---|---|---|---|---|
| 2015/0070242 | A1* | 3/2015 | Kawai | H03F 3/24 333/177 |
| 2015/0117281 | A1* | 4/2015 | Khlat | H03H 7/463 370/297 |
| 2016/0099685 | A1* | 4/2016 | Babaie | H03F 3/2171 333/100 |
| 2019/0081399 | A1* | 3/2019 | Ku | H03F 3/68 |
| 2020/0312539 | A1* | 10/2020 | Drabinski | H01F 29/025 |

OTHER PUBLICATIONS

Khalaf, et al., "A 60GHz 8-way phased array front-end with TR switching and calibration-free beamsteering in 28nm CMOS," European Solid State Circuits Conference, Sep. 2017, IEEE, pp. 203-206.
Lee, et al., "W-Band CMOS 4-Bit Phase Shifter for High Power and Phase Compression Points," IEEE Transactions on Circuits and Systems—II: Express Briefs, vol. 62, Issue 1, Jan. 2015, 5 pages.
Sadhu, et al., "A 28-GHz 32-Element TRX Phased-Array IC With Concurrent Dual-Polarized Operation and Orthogonal Phase and Gain Control for 5G Communications," IEEE Journal of Solid-State Circuits, vol. 52, Issue 12, Dec. 2017, pp. 3373-3391.
Tsai, et al., "60GHz Passive and Active RF-path Phase Shifters in Silicon," Radio Frequency Integrated Circuits Symposium, 2009, pp. 223-226.
Yu, et al., "A 60GHz phase shifter integrated with LNA and PA in 65nm CMOS for phased array systems," IEEE Journal of Solid-State Circuits, vol. 45, Issue 9, Sep. 2010, pp. 1697-1709.
International Search Report and Written Opinion for International Patent Application No. PCT/EP2020/072058, mailed Apr. 19, 2021, 10 pages.

* cited by examiner

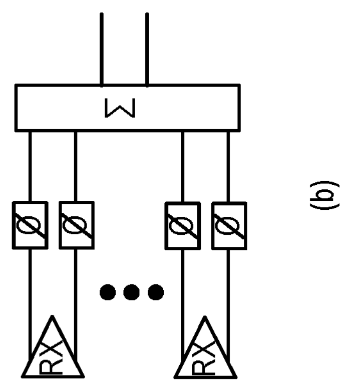
FIG. 1
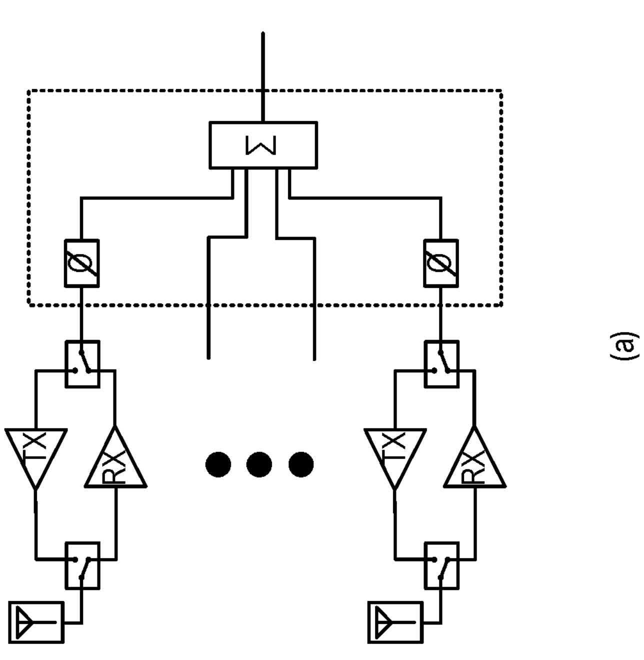

(a)

(b)

(c)

(d)

(e)

(f)

(g)

(h)

RF PHASE SHIFTER

TECHNICAL FIELD

The present disclosure relates to a Radio Frequency (RF) phase shifter.

This application is a 35 U.S.C. § 371 national phase filing of International Application No. PCT/EP2020/072058, filed Aug. 5, 2020, the disclosure of which is incorporated herein by reference in its entirety.

BACKGROUND

Phased-array transceivers rely on constructive interference from several antennas in order to focus and steer energy. The energy beam is formed by adjusting the delay in each branch of the array. The delay adjustment in each branch is realized by a phase shifter. Therefore, phase shifters are considered critical blocks in antenna array systems. The power distribution network is also important in that it splits (for transmit) and combines (for receive) the transmitted/received signal.

A Radio Frequency (RF) transceiver including an RF-phase shifting phased-array architecture is shown in FIG. 1(*a*). In the illustrated example, the RF transceiver is configured in receive (RX) mode. For the RX mode, for each RX branch starting from the antenna for that RX branch, a first switch routes the received signal to the Low Noise Amplifier (LNA), and a second switch routes the amplified received signal to the phase shifter, where the phase of the amplified received signal is adjusted. The signal combiner sums the signals from multiple (N) RX branches and sends the combined signal to the downconversion circuit (e.g., a mixer). For the transmit (TX) mode, for each TX branch, the signal combiner becomes a signal splitter. The resulting N signals for the N TX branches are phase shifted by the respective phase shifters. The phase shifted signals are amplified and transmitted via the respective antennas.

The architecture of FIG. 1(*a*) introduces several challenges. If the N RX branches represent the receive signals as differential signals, as represented in FIG. 1(*b*), 2*N phase shifters are needed. The same is true for TX mode. Considering that phase shifters are based on lossy passive elements, reducing the number of phase shifters used is of great interest. The distribution network also needs to be optimized, independently of the number of branches (N). This is not the case if Wilkinson combiners/splitters are used. In TX mode, losses in the phase shifting and splitting operation will require more gain from the Power Amplifier (PA). In RX mode, losses in the phase shifting and combining will increase the sensitivity to mixer noise.

As mentioned above, one issue with conventional RF phase shifters is that they are typically based on lossy passive elements. Further, several RF phase shifters can be connected in series to obtain large phase shifts, increasing the total losses, as in Lee et al., "W-Band CMOS 4-Bit Phase Shifter for High Power and Phase Compression Points", IEEE Transactions on Circuits and Systems-II: Express Briefs, Vol. 62, No. 1, January 2015 and Jeon et al., "A High Linearity +44.5-dBm IP3 C-Band 6-Bit Digital Phase Shifter Using SOI Technology for Phased Array Applications", IEEE Microwave and Wireless Components Letters, Vol. 29, No. 11, November 2019.

Reflective Type Phase Shifters (RTPSs) have demonstrated good performance for 60 Gigahertz (GHz) applications (see Tsai et al., "60 GHz Passive and Active RF-path Phase Shifters in Silicon", IEEE Radio Frequency Integrated Circuits Symposium, June 2009). RTPSs are based on quadrature hybrids and a complex load. It is possible to cascade them at the expanse of increased losses.

Finally, Sadhu et al., "A 28-GHz 32-Element TRX Phased-Array IC With Concurrent Dual-Polarized Operation and Orthogonal Phase and Gain Control for 5G Communications", IEEE Journal of Solid-State Circuits, Vol. 52, No. 12, December 2017 describes phase shifters that are based on switching a transmission line capacitance and inductance. This solution achieves high accuracy on the phase resolution.

Active phase shifters are not considered herein for phased-array applications because they cause an increase of the power consumption. Rather, focus herein is on passive phase shifters. However, for completeness, Khalaf et al., "A 60 GHz 8-way phased array front-end with TR switching and calibration-free beamsteering in 28 nm CMOS", 43$^{rd}$ IEEE European Solid State Circuits Conference, September 2017 and Yu et al., "A 60 GHz Phase Shifter Integrated With LNA and PA in 65 nm CMOS for Phased Array Systems", IEEE Journal of Solid-State Circuits, Vol. 45, No. 9, September 2010 demonstrated some active phase shifters for phased-array applications.

SUMMARY

Embodiments of a Radio Frequency (RF) phase shifter are disclosed. In one embodiment, an RF phase shifter comprises a first transformer comprising a primary winding coupled to a first RF port of the RF phase shifter and a secondary winding that is magnetically coupled to the primary winding. The RF phase shifter further comprises at least one capacitor circuit having a first terminal coupled to the secondary winding of the first transformer and a second terminal coupled to a primary winding of a second transformer. The RF phase shifter and combiner further comprises the second transformer, where the primary winding of the secondary transformer is coupled to the second terminal of the at least one capacitor circuit, and a secondary winding of the second transformer is coupled to a second RF port of the RF phase shifter. In this manner, an RF phase shifter is provided that is easily scalable for large phased-array transceivers.

In one embodiment, a phase shift at the second RF port of the RF phase shifter relative to the first RF port of the RF phase shifter is a function of an inductance of the secondary winding of the first transformer, a capacitance of the at least one capacitor circuit, and an inductance of the primary winding of the second transformer.

In one embodiment, at least one parameter of the RF phase shifter is configurable. The at least one parameter comprising: (a) an inductance of the secondary winding of the first transformer, (b) a capacitance of the at least one capacitor circuit, (c) an inductance of the primary winding of the second transformer, or (d) a combination of any two or more of (a)-(c).

In one embodiment, the secondary winding of the first transformer comprises multiple taps, and the RF phase shifter further comprises switching circuitry that selectively couples at least one of the multiple taps to ground to thereby configure the secondary winding of the first transformer to have one of a plurality of inductance values. In one embodiment, the primary winding of the second transformer comprises multiple taps, the RF phase shifter further comprises switching circuitry that selectively couples at least one of the multiple taps of the primary winding of the second transformer to ground to thereby configure the primary winding of the second transformer to have one of a plurality of inductance values.

In one embodiment, a capacitance of the at least one capacitor circuit is configurable.

In one embodiment, the first RF port of the RF phase shifter is a differential first RF port. In one embodiment, one tap of the primary winding of the first transformer is coupled to a positive port of the differential first RF port and another tap of the primary winding of the first transformer is coupled to a negative port of the differential first RF port.

In one embodiment, the first RF port of the RF phase shifter is a single-ended first RF port. In one embodiment, one tap of the primary winding of the first transformer is coupled to the single-ended first RF port.

In one embodiment, a tap of the secondary winding of the first transformer serves as a single-ended port of the first transformer, and the at least one capacitor circuit comprises a capacitor circuit having a first terminal that is coupled to the single-ended port of the first transformer and a second terminal coupled to a tap of the primary winding of the second transformer that serves as a single-ended port of the second transformer.

In one embodiment, two taps of the secondary winding of the first transformer serve as a differential port of the first transformer, and the at least one capacitor circuit comprises a first capacitor circuit and a second capacitor circuit. The first capacitor circuit has a first terminal that is coupled to a positive port of the differential port of the first transformer and a second terminal coupled to a tap of the primary winding of the second transformer that serves as a positive port of a differential port of the second transformer. The second capacitor circuit has a first terminal that is coupled to a quadrature-phase port of the differential port of the first transformer and a second terminal coupled to a tap of the primary winding of the second transformer that serves as a quadrature-phase port of the differential port of the second transformer.

In one embodiment, the second RF port of the RF phase shifter is a single-ended second RF port.

In one embodiment, the second RF port of the RF phase shifter is a differential second RF port.

In one embodiment, the RF phase shifter is an RF phase shifter and combiner/splitter, the first RF port is a first split RF port, the second RF port is a combined RF port, and the second terminal of the at least one capacitor circuit is coupled to a first separate portion of the primary windings of the second transformer. The RF phase shifter and combiner/splitter further comprises a third transformer comprising a primary winding coupled to a second split RF port of the RF phase shifter and combiner/splitter and a secondary winding that is magnetically coupled to the primary winding. The RF phase shifter and combiner/splitter further comprises at least one second capacitor circuit having a first terminal coupled to the secondary winding of the third transformer and a second terminal coupled to a second separate portion of the primary windings of the second transformer.

BRIEF DESCRIPTION OF THE DRAWINGS

The accompanying drawing figures incorporated in and forming a part of this specification illustrate several aspects of the disclosure, and together with the description serve to explain the principles of the disclosure.

FIG. 1 illustrates an architecture for a phased-array transceiver including Radio Frequency (RF) phase shifters;

DETAILED DESCRIPTION

The embodiments set forth below represent information to enable those skilled in the art to practice the embodiments and illustrate the best mode of practicing the embodiments. Upon reading the following description in light of the accompanying drawing figures, those skilled in the art will understand the concepts of the disclosure and will recognize applications of these concepts not particularly addressed herein. It should be understood that these concepts and applications fall within the scope of the disclosure.

Embodiments of a passive Radio Frequency (RF) phase shifter that mitigates losses, even for large phase-shift values, are disclosed herein. In addition, embodiments of an RF phase shifting phased-array that utilize the RF phase shifter are also disclosed herein. Further, in some embodiments, the RF phase shifter provides differential to single-ended conversion prior to phase shifting in order to reduce the number of required phase shifters.

Figure 2:
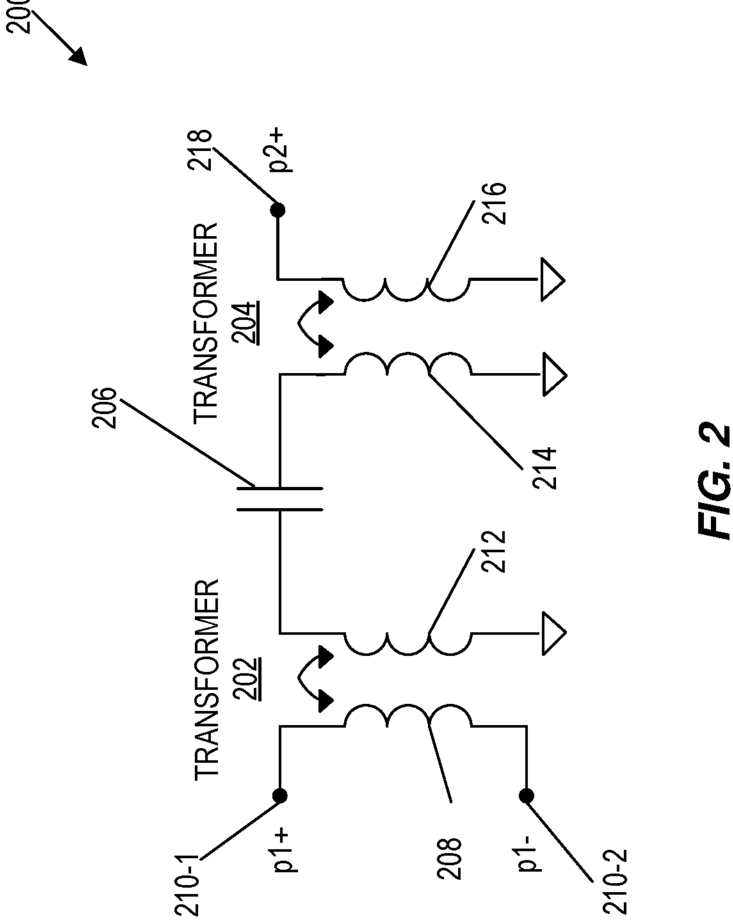
FIG. 2 illustrates an RF phase shifter in accordance with one embodiment of the present disclosure.

In this regard, FIG. 2 illustrates an RF phase shifter 200 in accordance with one embodiment of the present disclosure. As illustrated, the RF phase shifter 200 includes a first transformer 202 coupled to a second transformer 204 via a capacitor circuit 206. While the capacitor circuit 206 is illustrated as a single capacitor for clarity, it should be understood that the capacitor circuit 206 may include one or more capacitors (e.g., connected in parallel).

The first transformer 202 includes a primary winding 208 having a first tap coupled to a positive port (p1+) 210-1 of a differential RF port 210-1, 210-2 and a second tap coupled to a negative port 210-2 (p1−) of the differential RF port 210-1, 210-2. Note that while the RF port 210 is a differential port in the illustrated example, as discussed below, the RF port 210 may alternatively be a single-ended port. For this reason, the RF port, whether differential or single-ended, is referred to herein as the RF port 210. The first transformer 202 also includes a secondary winding 212, which is magnetically coupled to the primary winding 208. In this example, one terminal (or tap) of the secondary winding 212 of the first transformer 202 is coupled to a first terminal of the capacitor circuit 206, and the other terminal (or tap) of the secondary winding 212 of the first transformer 202 is connected to ground. In this manner, the secondary winding 212 of the first transformer 202 is configured to provide a single-ended connection to the capacitor circuit 206 (i.e., the first transformer 202 is configured to perform differential to single-ended conversion in this example). It should be noted that a “winding” may also be referred to as an “inductor”.

The other terminal of the capacitor circuit 206 is coupled to a tap of a primary winding 214 of the second transformer

204. Another tap of the primary winding 214 is coupled to ground. The second transformer 204 also includes a secondary winding 216 that is magnetically coupled to the primary winding 214. In this example, a second RF port 218 of the RF phase shifter 200 is a single-ended output and, as such, one tap of the secondary winding 216 is coupled to the second RF port 218 of the RF phase shifter 200, and another tap of the secondary winding 216 is coupled to ground.

Importantly, the phase shift applied by the RF phase shifter 200 is a function of an inductance (L) of the secondary winding 212 of the first transformer 202, a capacitance (C) of the capacitor circuit 206, and an inductance (L) of the primary winding 214 of the second transformer 204. In particular, assuming that the inductances of the primary and secondary windings 208 and 212 of the first transformer 202 and the inductances of the primary and secondary windings 214 and 216 of the second transformer 204 are all equal to an inductance value L and that the capacitance of the capacitor circuit 206 is a value C, then L and C can be defined as a function of the desired phase shift ($\phi$) as follows:

$$C = (\omega_0 * Z_0 * \sin(\phi))^{-1}$$

$$L = Z_0 * \left(\omega_0 * \tan\left(\frac{\phi}{2}\right)\right)^{-1}$$

where $\omega_0$ is the angular frequency (in radians/second) at which the phase shift $\phi$ is obtained, $Z_0$ is the characteristic impedance, and $\phi$ is the desired phase shift to be provided by the RF phase shifter 200. Thus, by varying L and C, different phase shifts can be achieved. Note that the equations above are based on an ideal circuit. However, in real-world implementations, the circuit is non-ideal (e.g., there are parasitic capacitances) and, as such, the actual values of L and C will vary slightly from the ideal values described above, as will be understood by those of skill in the art. Taking these non-ideal aspects into account when selecting the actual values of circuit elements in order to achieve the desired phase shift is well within the skill of those of skill in the art.

The phase shift of the RF phase shifter 200 (i.e., the phase shift at the second RF port 218 relative to the RF input port 210) is a function of the inductances of the primary and secondary windings 208 and 212 of the first transformer 202, the inductances of the primary and secondary windings 214 and 216 of the second transformer 204, and the capacitance of the capacitor circuit 206 is a value C. Thus, in one embodiment, the inductances of the first and second transformers 202 and 204 and/or the capacitance of the capacitor circuit 206 are configurable to achieve different phase shift values. For example, as discussed below with respect to a particular embodiment in which the RF phase shifter 200 is used within an RF phase shifting phased-array (see, e.g., FIGS. 7 and 8), the primary winding 208 and the secondary winding 212 of the first transformer 202 as well as the primary winding 214 and the secondary winding 216 of the second transformer 204 may each have multiple taps, where a "tap" is a connection point along the winding. Different inductance values (L) can be achieved by selectively grounding taps. As a specific example, a winding may have an overall inductance $L_0$ and have five taps (including a tap at the start of the winding and a tap at the ending of the winding) that are equally spaced along the length of winding thereby creating four winding segments or portions. Then, by coupling an RF input to the tap at the start of the winding and grounding only the tap at the end of the winding, then the inductance of the winding is $L=L_0$. However, by instead grounding the second of the five taps (with the third, fourth, and fifth taps being grounded or open), the inductance of the winding is $L=L_1$. Similarly, by instead grounding the third of the five taps (with the second tap open and the fourth and fifth taps grounded or open), the inductance of the winding is $L=L_2$. Similarly, by instead grounding the fourth of the five taps (with the second and third taps open and the fifth tap grounded or open), the inductance of the winding is $L=L_3$. Thus, by selectively grounding the taps of the winding (e.g., using switching circuitry controlled by a control signal from an associated controller), different values of L, and thus different phase shifts, can be achieved. The capacitor circuit 206 may additionally or alternatively be configurable. For example, the capacitor circuit 206 may include a capacitor bank having multiple capacitors that can be switched into or out of a parallel circuit of capacitors to achieve different capacitance values. This capacitor bank may, e.g., be controlled by an associated controller to achieve different capacitance values and thus different phase-shift values.

Figure 3:
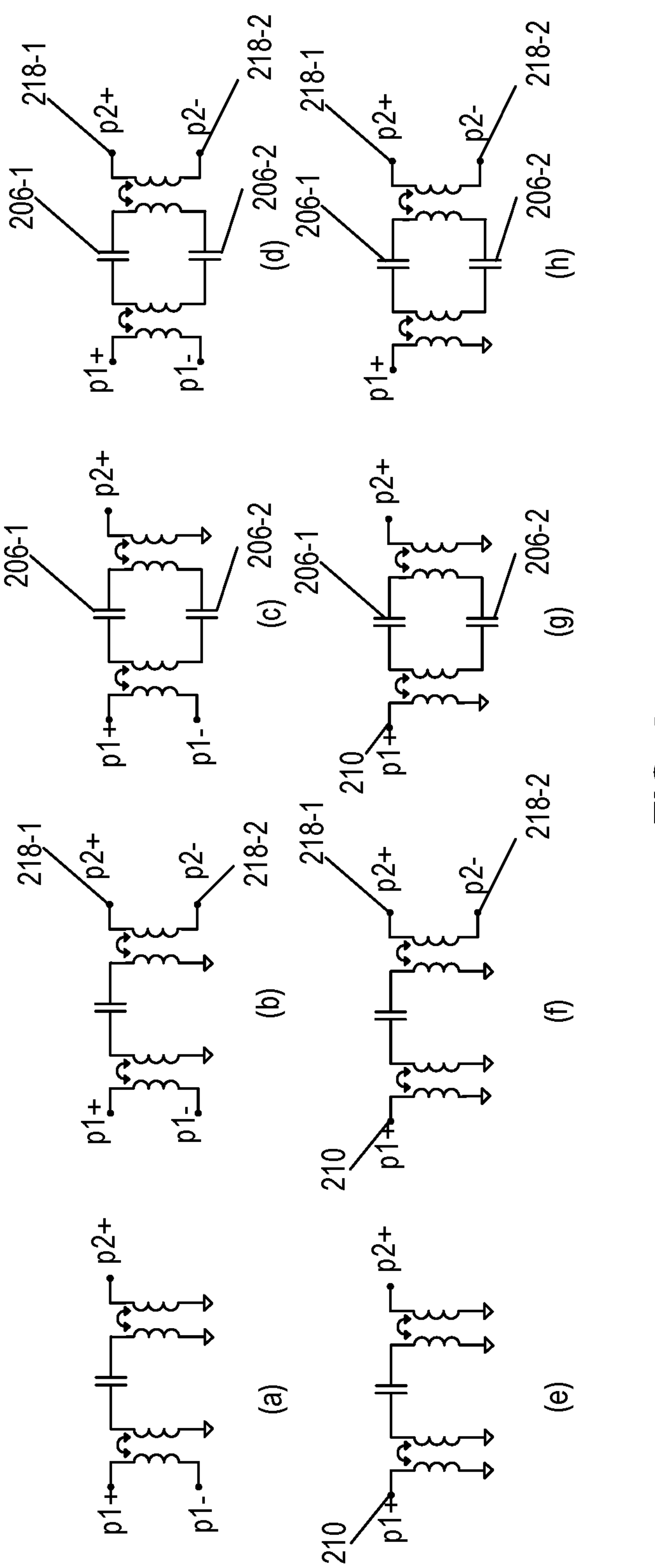
FIG. 3 illustrates a number of variations of the RF phase shifter of FIG. 2.

In the example of FIG. 2, the RF port 210 of the RF phase shifter 200 is differential and the first transformer 202 performs differential to single-ended conversion. However, the RF phase shifter 200 is not limited thereto. In this regard, FIG. 3 illustrates a number of variations of the RF phase shifter 200. FIGS. 3(*a*) through 3(*d*) illustrate examples in which the RF port 210 is differential. In particular, FIG. 3(*a*) illustrates the same example as in FIG. 2. FIG. 3(*b*) illustrates an example that is the same as that of FIG. 3(*a*) but where the second transformer 204 performs single-ended to differential conversion (i.e., the second RF port 218 is a differential RF output port 218-1, 218-2). FIG. 3(*c*) illustrates an example in which the first transformer 202 is configured to have a differential terminal at the secondary winding side (i.e., the first transformer 202 does not perform differential to single-ended conversion) and the second transformer 204 performs differential to single-ended conversion. FIG. 3(*d*) is the same as FIG. 3(*c*) but where the second RF port 218 of the RF phase shifter 200 is also differential. FIGS. 3(*e*) through 3(*h*) illustrate examples that are the same as those of FIGS. 3(*a*) through 3(*d*) but where the RF port 210 is a single-ended RF port. It should be noted that the RF phase shifter 200 is reversible. In other words, in one configuration, the RF port 210 is the RF input port and the second RF port 218 is the RF output port. However, in another embodiment, the second RF port 218 is the RF input port, and the RF port 210 is the RF output port.

Figure 4:
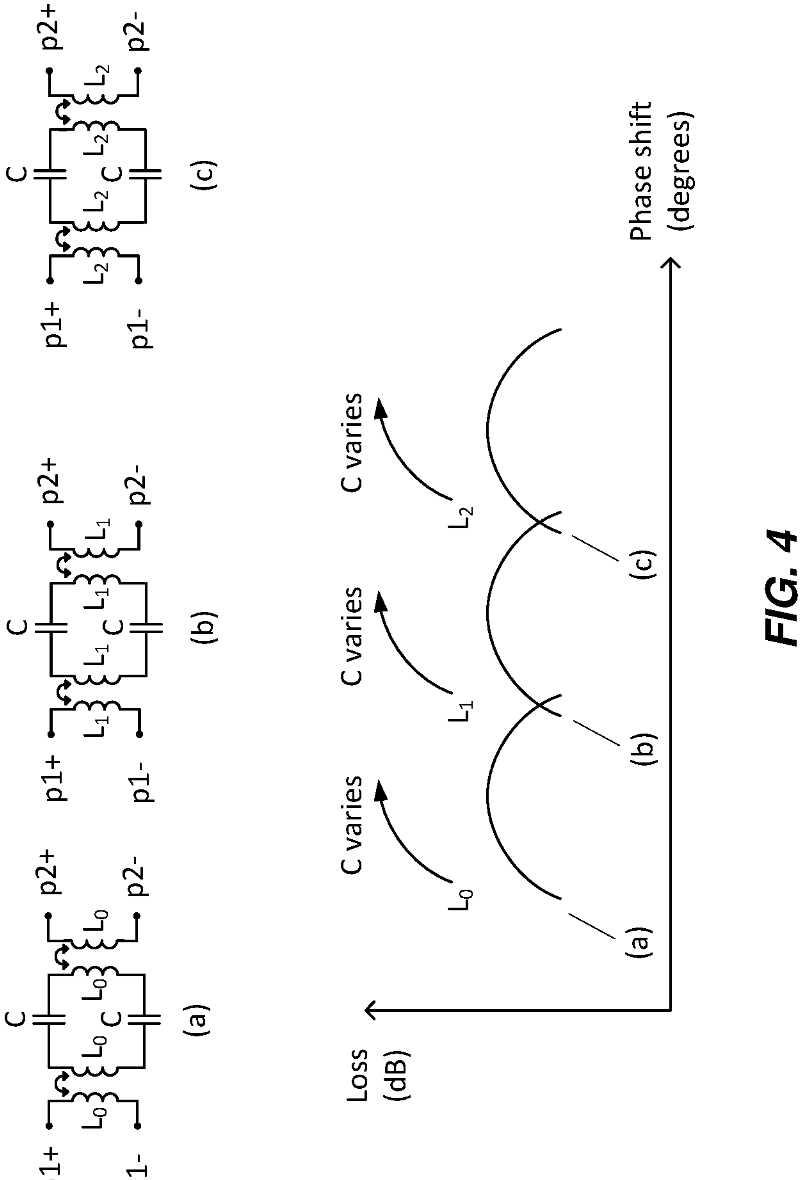
FIG. 4 shows an example of how the phase shift of the RF phase shifter of FIGS. 2 and 3 can be tuned in accordance with an embodiment of the present disclosure.

FIG. 4 shows an example of how the phase-shift of the RF phase shifter 200 can be tuned in accordance with an example embodiment of the present disclosure. Note that the tuning may be performed by, e.g., an associated controller by controlling associated control signals provided to the RF phase shifter 200. In the example of FIG. 4, the inductance L can be tuned to either a value "$L_0$", a value "$L_1$", or a value "$L_2$". The chart in FIG. 4 illustrates example simulation results. The left-most curve illustrates that different phase shifts can be achieved by tuning the capacitance C while the inductance is set to the value "$L_0$", the middle curve illustrates that different phase shifts can be achieved by tuning the capacitance C while the inductance is set to the value "$L_1$", and the right-most curve illustrates that different phase shifts can be achieved by tuning the capacitance C while the inductance is set to the value "$L_2$".

Figure 5:
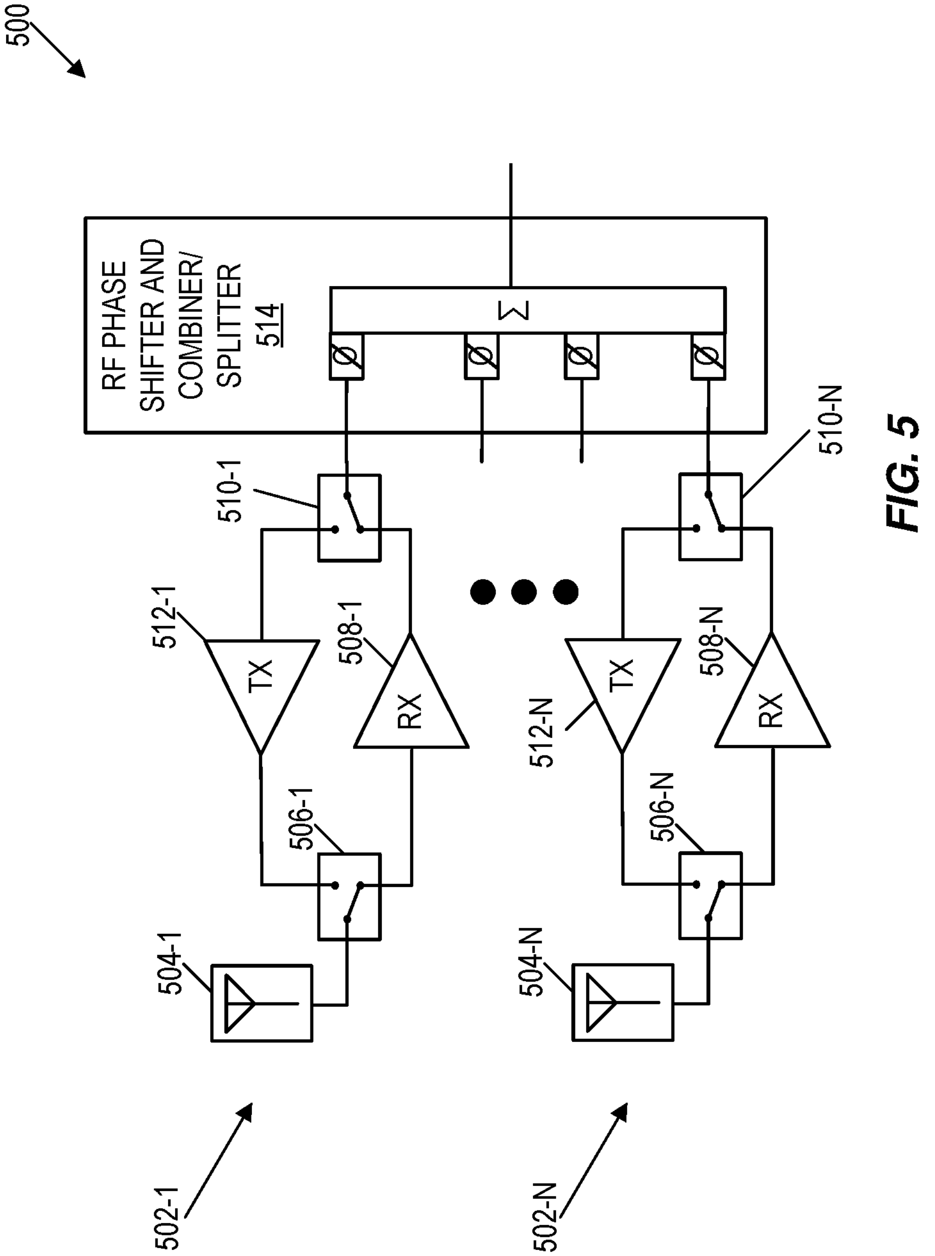
FIG. 5 illustrates a phased-array transceiver including an RF phase shifter and combiner/splitter in accordance with one example embodiment of the present disclosure.

As described below, embodiments are also disclosed wherein the RF phase shifter 200 is utilized for phase shifting and combining or splitting in a transceiver having a phased-array architecture. In this regard, FIG. 5 illustrates a transceiver 500 in accordance with one example embodiment of the present disclosure. As illustrated, the transceiver 500 includes a number (N) of transmit (TX)/receive (RX) branches 502-1 through 502-N, where N is greater than or equal to two (2). Each TX/RX branch 502-*n* (where "n" is used herein as an index in the range of 1 to N) includes an antenna 404-*n*, a switch 406-*n*, an RX amplifier 408-*n* (i.e., a Low Noise Amplifier (LNA)), a switch 410-*n*, and a TX amplifier 412-*n* (i.e., a Power Amplifier (PA)), arranged as shown. Looking at the RX mode, the switch 406-*n* is configured such that the antenna 404-*n* is coupled to the input of the RX amplifier 408-*n*, and the switch 410-*n* is configured such that the output of the RX amplifier 408-*n* is output to an RF phase shifter and combiner 514, which performs phase shifting and combining of the receive signals from the TX/RX branches 502-1 through 502-N as described below. Conversely, looking at the TX mode, the switch 406-*n* is configured such that the antenna 404-*n* is coupled to the output of the TX amplifier 412-*n*, and the switch 410-*n* is configured such that the input of the TX amplifier 412-*n* is coupled to an RF phase shifter and splitter 514, which performs splitting and phase shifting of the transmit signal. Since combining is performed in RX mode and splitting is performed in TX mode, element 514 is referred to herein as the RF phase shifter and combiner/splitter 514.

Figure 6:
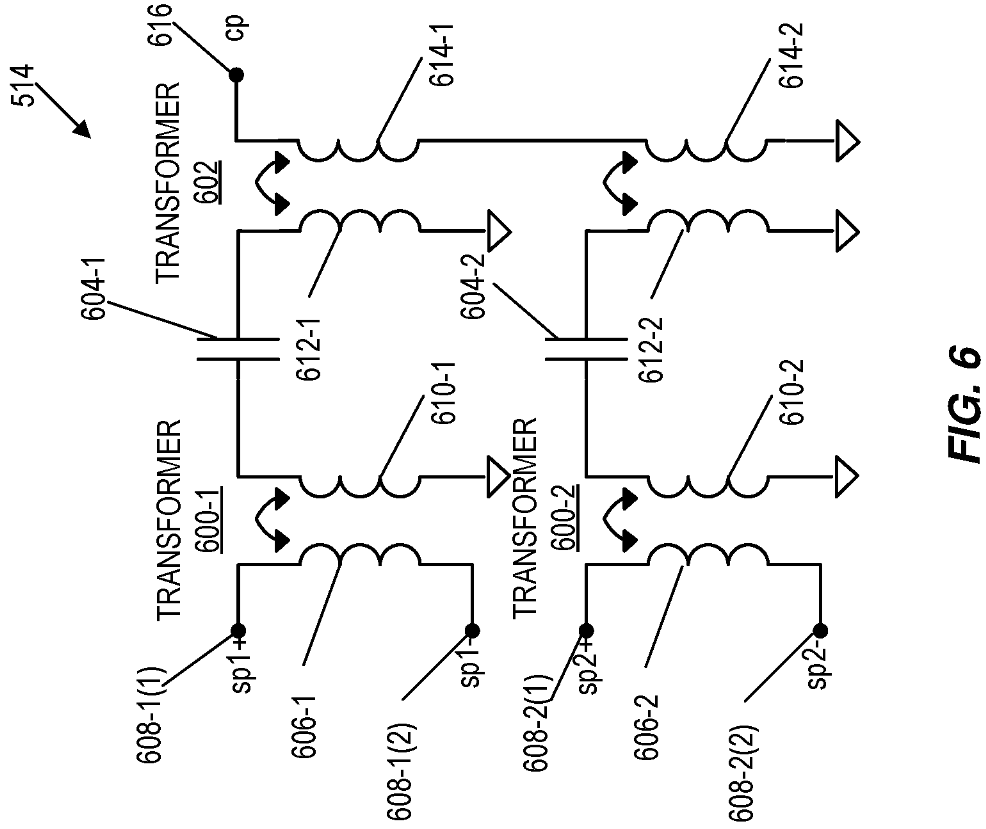
FIG. 6 illustrates an embodiment of the RF phase shifter and combiner/splitter of FIG. 5 for an example where N=2.

FIG. 6 illustrates an embodiment of the RF phase shifter and combiner/splitter 514 for an example where N=2. Note that the architecture of the RF phase shifter and combiner/splitter 514 of FIG. 6 can easily be extended to cases where N is greater than 2. As illustrated, for the first branch (i.e., for n=1), the RF phase shifter and combiner/splitter 514 includes a first transformer 600-1 coupled to a second transformer 602 via a capacitor circuit 604-1. While the capacitor circuit 604-1 is illustrated as a single capacitor for clarity, it should be understood that the capacitor circuit 604-1 may include one or more capacitors (e.g., connected in parallel).

The first transformer 600-1 includes a primary winding 606-1 having a first tap coupled to a positive port (sp1+) 608-1(1) of a differential RF port 608-1(1), 608-1(2) (where "sp" denotes a "split port" where the term "split port" is simply to differentiate the ports on the non-combined side of the RF phase shifter and combiner/splitter 514 from port on the combined (or non-split) side of the RF phase shifter and combiner/splitter 514) and a second tap coupled to a negative port (sp1−) 608-1(2) of the differential RF port 608-1(1), 608-1(2). Note that while the RF port 608-1 is a differential port in the illustrated example, the RF port 608-1 may alternatively be a single-ended port. For this reason, the RF port, whether differential or single-ended, is referred to herein as the RF port 608-1. Also, the RF port 608-1 is referred to a "split" RF port to differentiate it from a combined RF port 616 of the RF phase shifter and combiner/splitter 614. The first transformer 600-1 also includes a secondary winding 610-1, which is magnetically coupled to the primary winding 606-1. In this example, one terminal (or tap) of the secondary winding 610-1 of the first transformer 600-1 is coupled to a first terminal of the capacitor circuit 604-1, and the other terminal (or tap) of the secondary winding 610-1 of the first transformer 600-1 is coupled to ground. In this manner, the secondary winding 610-1 of the first transformer 600-1 is configured to provide a single-ended connection to the capacitor circuit 604-1 (i.e., the first transformer 600-1 is configured to perform differential to single-ended conversion in this example). The other terminal of the capacitor circuit 604-1 is coupled to a tap for a first separate portion 612-1 of primary windings 612 of the second transformer 602. Note that, in this example, the first separate portion 612-1 together with a second separate portion 612-2 form the primary windings 612 of the second transformer 602. Another tap of the first separate portion 612-1 of the primary windings 612 is coupled to ground.

In a similar manner, for the second branch (i.e., for n=2), the RF phase shifter and combiner/splitter 514 includes a transformer 600-2 that is also coupled to the second transformer 602 via a capacitor circuit 604-2. While the capacitor circuit 604-2 is illustrated as a single capacitor for clarity, it should be understood that the capacitor circuit 604-2 may include one or more capacitors (e.g., a bank of capacitors connected in parallel).

The transformer 600-2 includes a primary winding 606-2 having a first tap coupled to a positive port (sp2+) 608-2(1) of a differential RF port 608-2(1), 608-2(2) and a second tap coupled to a negative port (sp2−) 608-2(2) of the differential RF port 608-2(1), 608-2(2). Note that while the RF port 608-2 is a differential port in the illustrated example, the RF port 608-2 may alternatively be a single-ended port. For this reason, the RF port, whether differential or single-ended, is referred to herein as the RF port 608-2. Also, the RF port 608-2 is referred to a "split" RF port to differentiate it from the combined RF port 616 of the RF phase shifter and combiner/splitter 614. The transformer 600-2 also includes a secondary winding 610-2, which is magnetically coupled to the primary winding 606-2. In this example, one terminal (or tap) of the secondary winding 610-2 of the transformer 600-2 is coupled to a first terminal of the capacitor circuit 604-2, and the other terminal (or tap) of the secondary winding 610-2 of the transformer 600-2 is coupled to ground. In this manner, the secondary winding 610-2 of the transformer 600-2 is configured to provide a single-ended connection to the capacitor circuit 604-2 (i.e., the transformer 600-2 is configured to perform differential to single-ended conversion in this example). The other terminal of the capacitor circuit 604-2 is coupled to a tap for a second separate portion 612-2 of the primary windings 612 of the second transformer 602. Another tap of the second separate portion 612-2 of the primary windings 612 is coupled to ground.

The second transformer 602 also includes a secondary winding 614 having a first portion 614-1 that is magnetically coupled to the first separate portion 612-1 of the primary windings 612 and a second portion 614-2 that is magnetically coupled to the second separate portion 612-2 of the primary windings. In this example, the secondary winding 614 is formed by two portions 614-1 and 614-2. In this example, the RF port 616 (referred to herein as a "combined" RF port to differentiate it from the RF ports on the other side of the RF phase shifter and combiner/splitter 514) of the RF phase shifter and combiner/splitter 514 is a single-ended port and, as such, one tap of the secondary winding 614 is coupled to the RF port 616 of the RF phase shifter and combiner/splitter 514, and another tap of the secondary winding 614 is coupled to ground. In RX mode, at the RF port 616, the RF phase shifter and combiner/splitter 514 provides a combined signal that is the combination of the phase-shifted RF receive signals from the N RX branches 502-1 through 502-N of the transceiver 500. In the TX mode, a TX signal is received at the RF port 616 and split into N TX signals that are phase-shifted for the N TX branches 502-1 through 502-N.

Importantly, the phase shift applied by the RF phase shifter and combiner/splitter 514 for each branch 502-*n* is a function of an inductance of the secondary winding 610-*n* of the first transformer 600-*n*, a capacitance of the capacitor circuit 604-*n*, and an inductance of the respective separate portion 612-*n* of the primary windings 612 of the second transformer 602. In particular, for each branch 502-*n*, assuming that the inductances of the primary and secondary windings 606-*n* and 610-*n* of the first transformer 600-*n* and the inductances of the respective separate portion 612-*n* of the primary windings 612 of the second transformer 602 are all equal to an inductance value L, that the respective portions 614-*n* of the secondary winding 614 of the second transformer 602 are L/N (where N is the total number of branches), and that the capacitance of the capacitor circuit 604-*n* is a value C, then L and C can be defined as a function of the desired phase shift (ϕ) for the branch 502-*n* as follows:

$$C = (\omega_0 * Z_0 * \sin(\phi))^{-1}$$

$$L = Z_0 * \left(\omega_0 * \tan\left(\frac{\phi}{2}\right)\right)^{-1}$$

where $\omega_0$ is the angular frequency (in radians/second) at which the phase shift ϕ is obtained, $Z_0$ is the characteristic impedance, and ϕ is the desired phase shift to be provided for the branch 502-*n*. Note that the equations above are based on an ideal circuit. However, in real-world implementations, the circuit is non-ideal (e.g., there are parasitic capacitances) and, as such, the actual values of L and C will vary slightly from the ideal values described above, as will be understood by those of skill in the art. Taking these non-ideal aspects into account when selecting the actual values of circuit elements in order to achieve the desired phase shift is well within the skill of those of skill in the art.

Further, in the same manner as described above for the RF phase shifter 200, the inductance (L) and/or the capacitance (C) for each branch 502-*n* are configurable in some embodiments. In this manner, the RF phase shifter and combiner/splitter 514 can be configured to provide the desired phase shifts for the branches 502-1 through 502-N. Further, in some embodiments, different branches 502-*n* may be configured with different phase shifts by separately configuring L and/or C for each branch 502-*n*.

Figure 7:
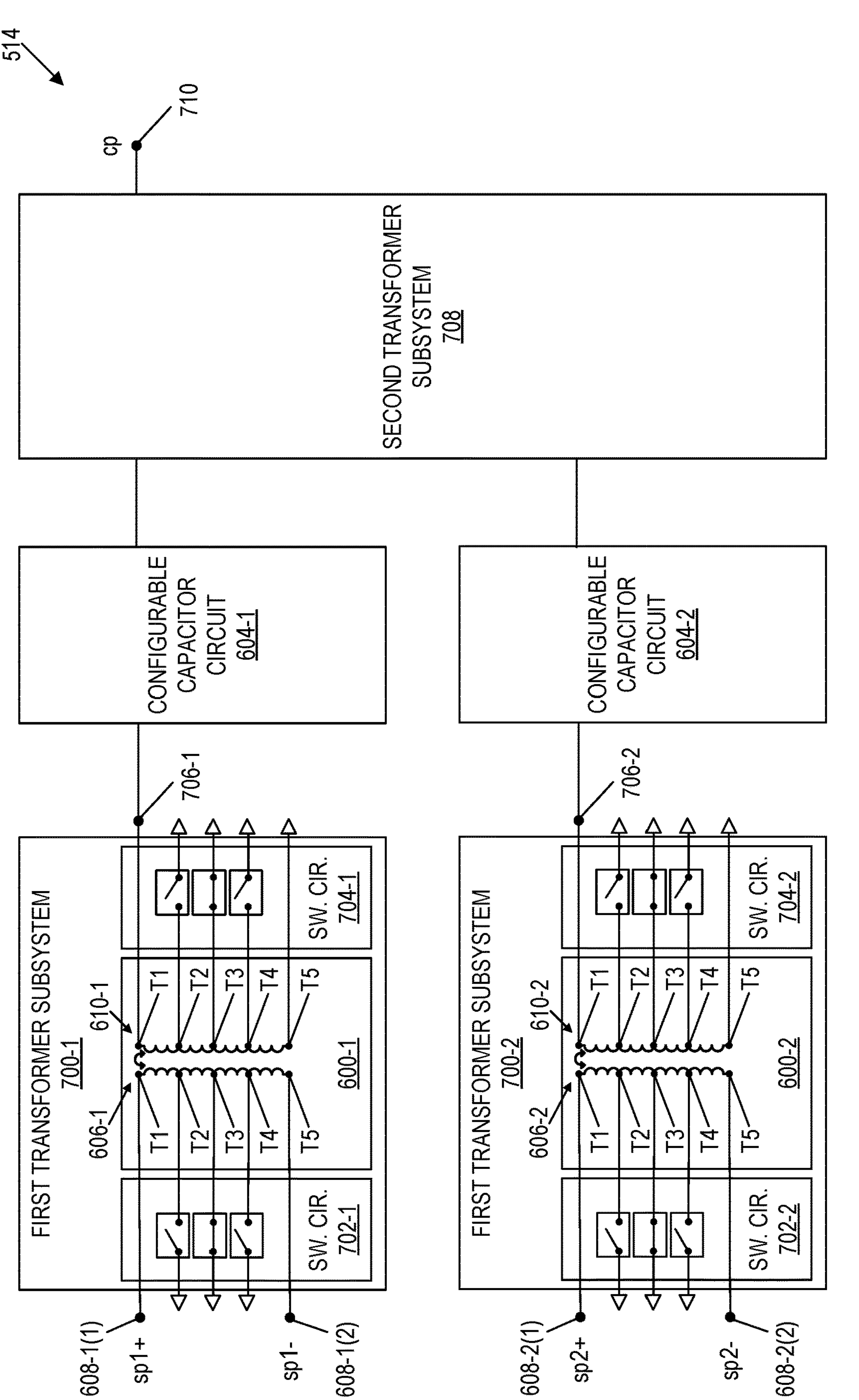
FIGS. 7 and 8 illustrate another embodiment of the RF phase shifter and combiner/splitter of FIG. 5.
Figure 8:
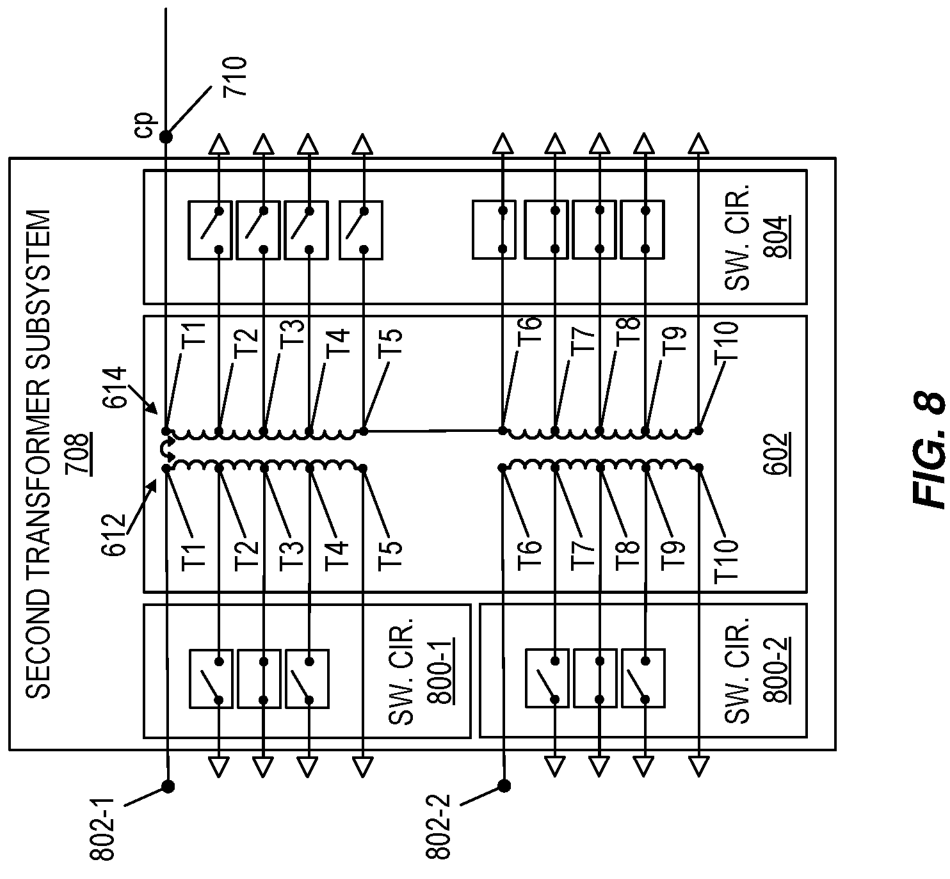

FIGS. 7 and 8 illustrate another embodiment of the RF phase shifter and combiner/splitter 514 in which switching circuitry is utilized to configure the inductances (L) for each branch. This embodiment is similar to that of FIG. 6 but additionally shows switching circuitry that is utilized to configure the inductances (L) for each branch. Again, in this example, there are two branches, but the architecture can easily be extended to more than two branches.

As illustrated, the RF phase shifter and combiner/splitter 514 includes, for each branch 502-*n*, a first transformer subsystem 700-*n* including the first transformer 600-*n*. The primary winding 606-*n* and the secondary winding 610-*n* of the first transformer 600-*n* each have multiple taps which are, in this example, spaced equally along the length of the respective winding. In this example, each has five taps, which are denoted as T1-T5. The first transformer subsystem 700-*n* also includes switching circuitry 702-*n* that operates to selectively connect or disconnect taps T2, T3, and T4 of the primary winding 606-*n* to ground to thereby configure the inductance (L) of the primary winding 606-*n*. In this example, tap T1 of the primary winding 606-*n* is coupled to the positive port (sp1+) 608-*n*(1) of the differential RF port 608-*n*, and tap T5 of the primary winding 606-*n* is coupled to the negative port (sp1−) 608-*n*(2) of the differential RF port 608-*n*. The switching circuitry 702-*n* is controlled (e.g., by an associated controller) to, in this example, either:

- disconnect taps T2, T3, and T4 from ground, in which case the inductance (L) of the primary winding 606-*n* is $L=L_0$,
- couple tap T3 to ground and disconnect taps T2 and T4 from ground, in which case the inductance (L) of the primary winding 606-*n* is $L=L_1$, or
- couple taps T2 and T4 to ground (and either couple tap T3 to ground or leave tap T3 open/disconnected, in which case the inductance (L) of the primary winding 606-*n* is $L=L_2$.

The first transformer subsystem 700-*n* also includes switching circuitry 704-*n* that operates to selectively connect or disconnect taps T2, T3, and T4 of the secondary winding 610-*n* to ground to thereby configure the inductance (L) of the secondary winding 610-*n*. In this example, tap T1 of the secondary winding 610-*n* is coupled to an output port 706-*n* of the first transformer subsystem 700-*n* and thus the input of the respective capacitor circuit 604-*n*, and tap T5 of the secondary winding 610-*n* is coupled to ground. The switching circuitry 704-*n* is controlled (e.g., by an associated controller) to, in this example, either:

- disconnect taps T2, T3, and T4 from ground, in which case the inductance (L) of the secondary winding 610-*n* is $L=L_0$,
- couple tap T3 to ground and disconnect taps T2 and T4 from ground, in which case the inductance (L) of the secondary winding 610-*n* is $L=L_1$, or
- couple taps T2 and T4 to ground (and either couple tap T3 to ground or leave tap T3 open/disconnected, in which case the inductance (L) of the secondary winding 610-*n* is $L=L_2$.

For each branch 502-*n*, the capacitor circuitry 604-*n* is a configurable capacitor circuit 604-*n*. For instance, the configurable capacitor circuit 604-*n* may be a capacitor bank including multiple capacitors that can be switched into or out of the circuit (e.g., under control of an associated controller) to thereby configure the capacitance (C) of the configurable capacitor circuit 604-*n*.

The configurable capacitor circuits 604-1 and 604-2 are coupled to a second transformer subsystem 708, as described above. The second transformer provides a combined RF output 710. FIG. 8 illustrates the second transformer subsystem 708 in accordance with one embodiment of the present disclosure. As illustrated, the second transformer subsystem 708 includes the second transformer 602. The primary windings 612 and the secondary winding 614 of the second transformer 602 each have multiple taps which are, in this example, spaced equally along the length of the respective winding. In this example, each has ten taps, which are denoted as T1-T10. Note that with respect to the primary windings 612, taps T1-T5 correspond to the first separate portion 612-1 of the primary windings 612, and taps T6-T10 correspond to the second separate portion 612-2 of the primary windings 612. Likewise, for the secondary winding 614, taps T1-T5 correspond to the first portion 614-1 of the secondary winding 614, and taps T6-T10 correspond to the second portion 614-2 of the secondary winding 614.

For the branch 502-1, the second transformer subsystem 708 also includes switching circuitry 800-1 that operates to selectively connect or disconnect taps T2-T4 of the first separate portion 612-1 of the primary windings 612 to ground to thereby configure the inductance (L) of the first separate portion 612-1 of the primary windings 612. In this example, tap T1 of the primary windings 612 is coupled to a port 802-1 which is coupled to the output of the capacitor circuit 604-1, and tap T5 of the primary windings 612 is coupled to ground. The switching circuitry 800-1 is controlled (e.g., by an associated controller) to, in this example, either:

- disconnect taps T2, T3, and T4 from ground, in which case the inductance (L) of the first separate portion 612-1 of the primary windings 612 is $L=L_0$,
- couple tap T3 to ground and disconnect taps T2 and T4 from ground, in which case the inductance (L) of the first separate portion 612-1 of the primary windings 612 is $L=L_1$, or
- couple taps T2 and T4 to ground (and either couple tap T3 to ground or leave tap T3 open/disconnected, in which case the inductance (L) of the first separate portion 612-1 of the primary windings 612 is $L=L_2$.

Likewise, for the branch 502-2, the second transformer subsystem 708 also includes switching circuitry 800-2 that operates to selectively connect or disconnect taps T6-T9 of the second separate portion 612-2 of the primary windings 612 to ground to thereby configure the inductance (L) of the second separate portion 612-2 of the primary windings 612. In this example, tap T6 of the primary windings 612 is coupled to a port 802-2 which is coupled to the output of the capacitor circuit 604-2, and tap T10 of the primary windings 612 is coupled to ground. The switching circuitry 800-2 is controlled (e.g., by an associated controller) to, in this example, either:

- disconnect taps T7, T8, and T9 from ground, in which case the inductance (L) of the second separate portion 612-2 of the primary windings 612 is $L=L_0$,
- couple tap T8 to ground and disconnect taps T7 and T9 from ground, in which case the inductance (L) of the second separate portion 612-2 of the primary windings 612 is $L=L_1$, or
- couple taps T7 and T9 to ground (and either couple tap T8 to ground or leave tap T8 open/disconnected, in which case the inductance (L) of the second separate portion 612-2 of the primary windings 612 is $L=L_2$.

The second transformer subsystem 708 also includes switching circuitry 804 that operates to selectively connect or disconnect taps T2-T10 of the secondary winding 614 to ground to thereby configure the inductance of the secondary winding 614. The inductance of the secondary winding 614 is preferably L/N, where L is the inductance of the separate portions 612-1 and 612-2 of the primary windings 612 of the second transformer 602. In this example, tap T1 of the secondary winding 614 is coupled to the RF port 608 of the RF phase shifter and combiner/splitter 514. The switching circuitry 804 is controlled (e.g., by an associated controller) to, in this example, ground at least one of the taps T1-T10 of the secondary winding 614 such that the inductance of the secondary winding 614 is L/N (i.e., $L_1$ in this example).

In operation, for RX mode, the RF phase shifter and combiner/splitter 514 operates to apply desired phase shifts to the RF RX signals received for the N branches 502-1 through 502-N. For each branch 502-*n*, the phase shift for the branch 502-*n* is a function of the inductance of the secondary winding 610-*n* of the first transformer 600-*n*, the capacitance of the capacitor circuit 604-*n*, and the inductance of the separate portion 612-*n* of the primary windings 612 of the second transformer 602. The phase-shift RF RX signals are combined by the second transformer 602 to provide a combined RF RX signal at the RF output port 710 of the RF phase shifter and combiner/splitter 514. Similar operation is provided for TX mode but in reverse.

Figure 9:
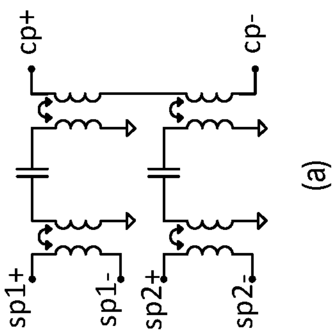
FIG. 9 illustrates a number of variations of the RF phase shifter and combiner/splitter of FIG. 6 and FIGS. 7 and 8.
Figure 9:
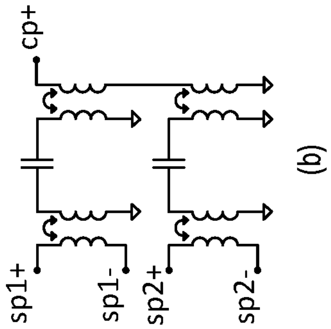
Figure 9:
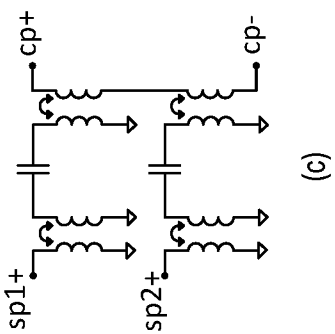
Figure 9:
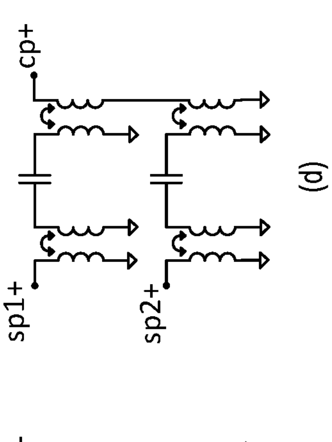
Figure 9:
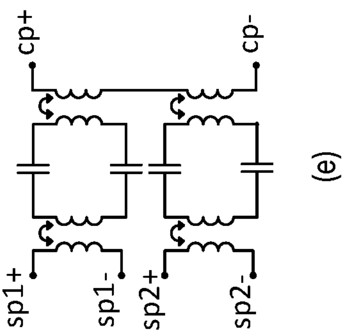
Figure 9:
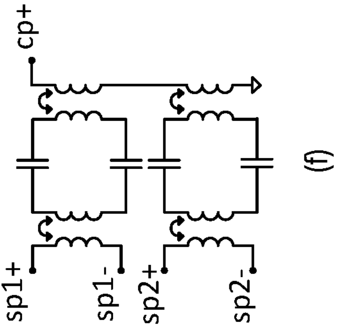
Figure 9:
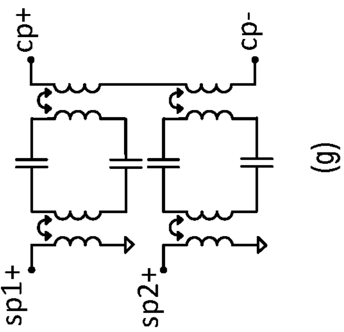
Figure 9:
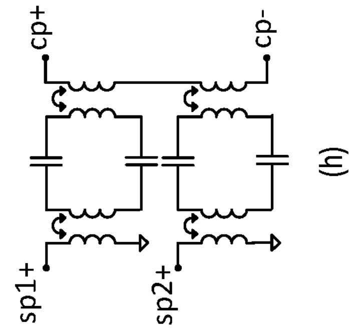

The architecture of the RF phase shifter and combiner/splitter 514 illustrated in FIGS. 6, 7, and 8 is only an example. FIG. 9 illustrates some other example implementations of the RF phase shifter and combiner/splitter 514. FIG. 9(*a*) illustrates a variation in which the RF output port 710 is a differential port. FIG. 9(*b*) is the same as that shown in FIG. 6. FIG. 9(*c*) illustrates a variation in which the RF ports 608-1 and 608-2 are single-ended, rather than differential, and the RF output port 710 is differential. FIG. 9(*d*) illustrates a variation in which the RF ports 608-1 and 608-2 are single-ended, rather than differential, and the RF output port 710 is single-ended. FIGS. 9(*e*) through 9(*h*) illustrate variations that are the same as those of FIGS. 9(*a*) through 9(*d*) but where the transformers 600-1 and 600-2 are transformers (denoted as transformers 600-1 and 600-2) that do not perform differential to single-ended conversion.

While not being limited thereto, the RF phase shifter 200 and the RF phase shifter and combiner/splitter 514 have a number of advantages over conventional RF phase shifters (and combiners). For example, in embodiments in which the RF input is differential and the first transformer 202, 700 performs differential to single-ended conversion, the RF phase shifter 200/514 only requires one RF phase shift per differential RF input, rather than a separate RF phase shift per differential branch of the differential RF input. As another example, transformers are potentially wideband. As yet another example, in one embodiment of the RF phase shifter and combiner/splitter 514, the RF phase shifter and combiner/splitter 514 is a single block that performs phase shifting, differential to single-ended conversion, and power combining from each branch. As another example, the RF phase shifter and combiner/splitter 514 is easily scalable for large phased-array transceivers.

Any appropriate steps, methods, features, functions, or benefits disclosed herein may be performed through one or more functional units or modules of one or more virtual apparatuses. Each virtual apparatus may comprise a number of these functional units. These functional units may be implemented via processing circuitry, which may include one or more microprocessor or microcontrollers, as well as other digital hardware, which may include Digital Signal Processors (DSPs), special-purpose digital logic, and the like. The processing circuitry may be configured to execute program code stored in memory, which may include one or several types of memory such as Read Only Memory (ROM), Random Access Memory (RAM), cache memory, flash memory devices, optical storage devices, etc. Program code stored in memory includes program instructions for executing one or more telecommunications and/or data communications protocols as well as instructions for carrying out one or more of the techniques described herein. In some implementations, the processing circuitry may be used to cause the respective functional unit to perform corresponding functions according one or more embodiments of the present disclosure.

While processes in the figures may show a particular order of operations performed by certain embodiments of the present disclosure, it should be understood that such order is exemplary (e.g., alternative embodiments may perform the operations in a different order, combine certain operations, overlap certain operations, etc.).

At least some of the following abbreviations may be used in this disclosure. If there is an inconsistency between abbreviations, preference should be given to how it is used above. If listed multiple times below, the first listing should be preferred over any subsequent listing(s).

dB Decibel
DSP Digital Signal Processor
GHz Gigahertz

LNA Low Noise Amplifier
PA Power Amplifier
RAM Random Access Memory
RF Radio Frequency
ROM Read Only Memory
RTPS Reflective Type Phase Shifter
RX Receive
TX Transmit Those skilled in the art will recognize improvements and modifications to the embodiments of the present disclosure. All such improvements and modifications are considered within the scope of the concepts disclosed herein.

What is claimed is:

1. A Radio Frequency, RF, phase shifter comprising:
- a first transformer comprising:
  - a primary winding coupled to a first RF port of the RF phase shifter; and
  - a secondary winding that is magnetically coupled to the primary winding;
- at least one capacitor circuit having:
  - a first terminal coupled to the secondary winding of the first transformer; and
  - a second terminal coupled to a primary winding of a second transformer;
- the second transformer comprising:
  - the primary winding coupled to the second terminal of the at least one capacitor circuit; and
  - a secondary winding coupled to a second RF port of the RF phase shifter;
- wherein the secondary winding of the first transformer comprises multiple taps; and
- the RF phase shifter further comprises switching circuitry that selectively couples at least one of the multiple taps to ground to thereby configure the secondary winding of the first transformer to have one of a plurality of inductance values.

2. The RF phase shifter of claim 1 wherein at least one parameter of the RF phase shifter is configurable, the at least one parameter comprising:
- a) the inductance of the secondary winding of the first transformer;
- b) the capacitance of the at least one capacitor circuit;
- c) the inductance of the primary winding of the second transformer; or
- d) a combination of any two or more of (a)-(c).

3. The RF phase shifter of claim 1 wherein:
- the primary winding of the second transformer comprises multiple taps; and
- the RF phase shifter further comprises switching circuitry that selectively couples at least one of the multiple taps of the primary winding of the second transformer to ground to thereby configure the primary winding of the second transformer to have one of a plurality of inductance values.

4. The RF phase shifter of claim 1 wherein a capacitance of the at least one capacitor circuit is configurable.

5. The RF phase shifter of claim 1 wherein the first RF port of the RF phase shifter is a differential first RF port.

6. The RF phase shifter of claim 5 wherein one tap of the primary winding of the first transformer is coupled to a positive port of the differential first RF port and another tap of the primary winding of the first transformer is coupled to a negative port of the differential first RF port.

7. The RF phase shifter of claim 1 wherein the first RF port of the RF phase shifter is a single-ended first RF port.

8. The RF phase shifter of claim 7 wherein one tap of the primary winding of the first transformer is coupled to the single-ended first RF port.

9. The RF phase shifter of claim 5 wherein:
- a tap of the secondary winding of the first transformer serves as a single-ended port of the first transformer; and
- the at least one capacitor circuit comprises a capacitor circuit having a first terminal that is coupled to the single-ended port of the first transformer and a second terminal coupled to a tap of the primary winding of the second transformer that serves as a single-ended port of the second transformer.

10. The RF phase shifter of claim 5 wherein:
- two taps of the secondary winding of the first transformer serve as a differential port of the first transformer; and
- the at least one capacitor circuit comprises:
  - a first capacitor circuit having a first terminal that is coupled to a positive port of the differential port of the first transformer and a second terminal coupled to a tap of the primary winding of the second transformer that serves as a positive port of a differential port of the second transformer; and
  - a second capacitor circuit having a first terminal that is coupled to a quadrature-phase port of the differential port of the first transformer and a second terminal coupled to a tap of the primary winding of the second transformer that serves as a quadrature-phase port of the differential port of the second transformer.

11. The RF phase shifter of claim 5 wherein the second RF port of the RF phase shifter is a single-ended second RF port.

12. The RF phase shifter of claim 5 wherein the second RF port of the RF phase shifter is a differential second RF port.

13. The RF phase shifter of claim 1 wherein:
- the RF phase shifter is an RF phase shifter and combiner/splitter;
- the first RF port is a first split RF port;
- the second RF port is a combined RF port;
- the second terminal of the at least one capacitor circuit is coupled to a first separate portion of the primary windings of the second transformer; and
- the RF phase shifter and combiner/splitter further comprises:
  - a third transformer comprising:
  - a primary winding coupled to a second split RF port of the RF phase shifter and combiner/splitter; and
  - a secondary winding that is magnetically coupled to the primary winding; and
  - at least one second capacitor circuit having:
  - a first terminal coupled to the secondary winding of the third transformer; and
  - a second terminal coupled to a second separate portion of the primary windings of the second transformer.

14. The RF phase shifter of claim 1, wherein a phase shift at the second RF port of the RF phase shifter relative to the first RF port of the RF phase shifter is a function of an inductance of the secondary winding of the first transformer, a capacitance of the at least one capacitor circuit, and an inductance of the primary winding of the second transformer.

15. The RF phase shifter of claim 1, wherein the phase shift at the second RF port of the RF phase shifter relative to the first RF port of the RF phase shifter is tunable by tuning the inductance of the primary winding of the second transformer.

16. A phased-array transceiver system comprising:

a plurality of antennas and a plurality of transmit or receive branches; and a Radio Frequency, RF, phase shifter comprising:

a first transformer comprising:

a primary winding coupled to a first RF port of the RF phase shifter; and a secondary winding that is magnetically coupled to the primary winding;

at least one capacitor circuit having:

a first terminal coupled to the secondary winding of the first transformer; and a second terminal coupled to a primary winding of a second transformer; and the second transformer comprising:

the primary winding coupled to the second terminal of the at least one capacitor circuit; and a secondary winding coupled to a second RF port of the RF phase shifter;

wherein the secondary winding of the first transformer comprises multiple taps; and the RF phase shifter further comprises switching circuitry that selectively couples at least one of the multiple taps to ground to thereby configure the secondary winding of the first transformer to have one of a plurality of inductance values.

17. A wireless communication device comprising a phased-array transceiver system, the phase array transceiver system comprising:

a plurality of antennas and a plurality of transmit or receive branches; and a Radio Frequency, RF, phase shifter comprising:

a first transformer comprising:

a primary winding coupled to a first RF port of the RF phase shifter; and a secondary winding that is magnetically coupled to the primary winding;

at least one capacitor circuit having:

a first terminal coupled to the secondary winding of the first transformer; and a second terminal coupled to a primary winding of a second transformer; and the second transformer comprising:

the primary winding coupled to the second terminal of the at least one capacitor circuit; and a secondary winding coupled to a second RF port of the RF phase shifter;

wherein the secondary winding of the first transformer comprises multiple taps; and the RF phase shifter further comprises switching circuitry that selectively couples at least one of the multiple taps to ground to thereby configure the secondary winding of the first transformer to have one of a plurality of inductance values.

18. A base station for a radio access network comprising a phased-array transceiver system, the phase array transceiver system comprising:

a plurality of antennas and a plurality of transmit or receive branches; and a Radio Frequency, RF, phase shifter comprising:

a first transformer comprising:

a primary winding coupled to a first RF port of the RF phase shifter; and a secondary winding that is magnetically coupled to the primary winding;

at least one capacitor circuit having:

a first terminal coupled to the secondary winding of the first transformer; and a second terminal coupled to a primary winding of a second transformer; and the second transformer comprising:

the primary winding coupled to the second terminal of the at least one capacitor circuit; and a secondary winding coupled to a second RF port of the RF phase shifter; and wherein the secondary winding of the first transformer comprises multiple taps; and the RF phase shifter further comprises switching circuitry that selectively couples at least one of the multiple taps to ground to thereby configure the secondary winding of the first transformer to have one of a plurality of inductance values.

* * * * *